United States Patent [19]
Noji et al.

[11] Patent Number: 6,051,053
[45] Date of Patent: Apr. 18, 2000

[54] TRAPPING DEVICE AND METHOD OF OPERATION THEREFOR

[75] Inventors: Nobuharu Noji; Norihiko Nomura; Tetsuro Sugiura, all of Fujisawa, Japan

[73] Assignee: Ebara Corporation, Tokyo, Japan

[21] Appl. No.: 08/990,577

[22] Filed: Dec. 15, 1997

[30] Foreign Application Priority Data

| Dec. 16, 1996 | [JP] | Japan | ................................. 8-353175 |
| Dec. 16, 1996 | [JP] | Japan | ................................. 8-353176 |
| Dec. 16, 1996 | [JP] | Japan | ................................. 8-353177 |

[51] Int. Cl.⁷ ........................................ B01D 8/00
[52] U.S. Cl. ................. 95/133; 95/281; 95/290; 96/230
[58] Field of Search .................. 95/127, 133, 281, 95/290; 96/228, 230

[56] References Cited

U.S. PATENT DOCUMENTS

| 1,842,263 | 1/1932 | Gobert | ............................. 95/290 X |
| 3,683,589 | 8/1972 | Seitz et al. | ............................. 95/127 X |
| 3,719,052 | 3/1973 | White | ............................. 62/3 |
| 4,551,197 | 11/1985 | Guilmette et al. | ............................. 156/642 |

FOREIGN PATENT DOCUMENTS

| 3207065 A1 | 9/1983 | Germany . |
| 4438874 A1 | 5/1996 | Germany . |
| 58-106186 | 6/1983 | Japan . |
| 58-133586 | 8/1983 | Japan . |
| 60-156983 | 8/1985 | Japan . |
| 1044889 | 10/1966 | United Kingdom . |
| 2272651 | 5/1994 | United Kingdom | ................. 95/290 |

OTHER PUBLICATIONS

Patent Abstracts of Japan, vol. 007, No. 211 (M–243), Sep. 17, 1983 & JP 58 106186 A (Hitachi Seisakusho KK), Jun. 24, 1983.

*Primary Examiner*—Robert H. Spitzer
*Attorney, Agent, or Firm*—Armstrong, Westerman, Hattori, McLeland & Naughton

[57] ABSTRACT

A trapping device that performs a regeneration operation efficiently so as to raise the overall operational reliability by improving the service life as well as to lower the capital and operation cost of the processing system. The trapping device includes an exhaust path for evacuating a spent gas from a hermetic chamber through a vacuum pump; a trap section for trapping component substances from the spent gas flowing through the exhaust path; a cleaning path disposed adjacent to the exhaust path for flowing a cleaning solution for cleaning the trap section; and driving device for transposing the trap section to communicate either with the exhaust path or with the cleaning path.

17 Claims, 14 Drawing Sheets

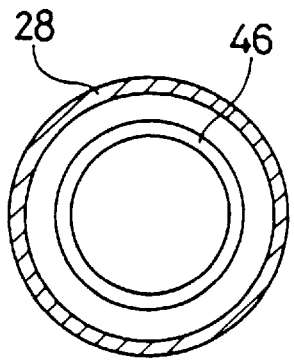
F I G. 4A
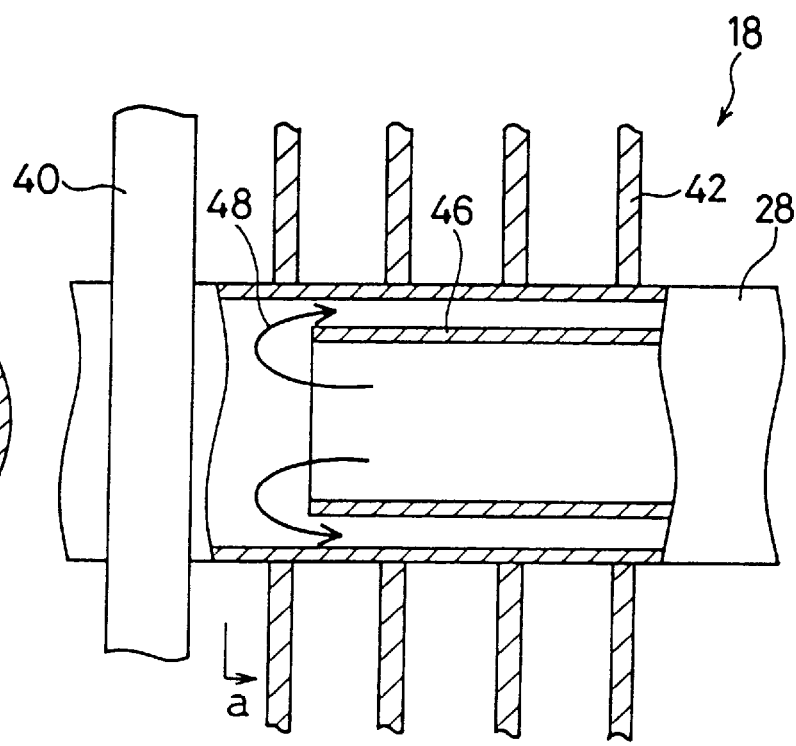
F I G. 4B

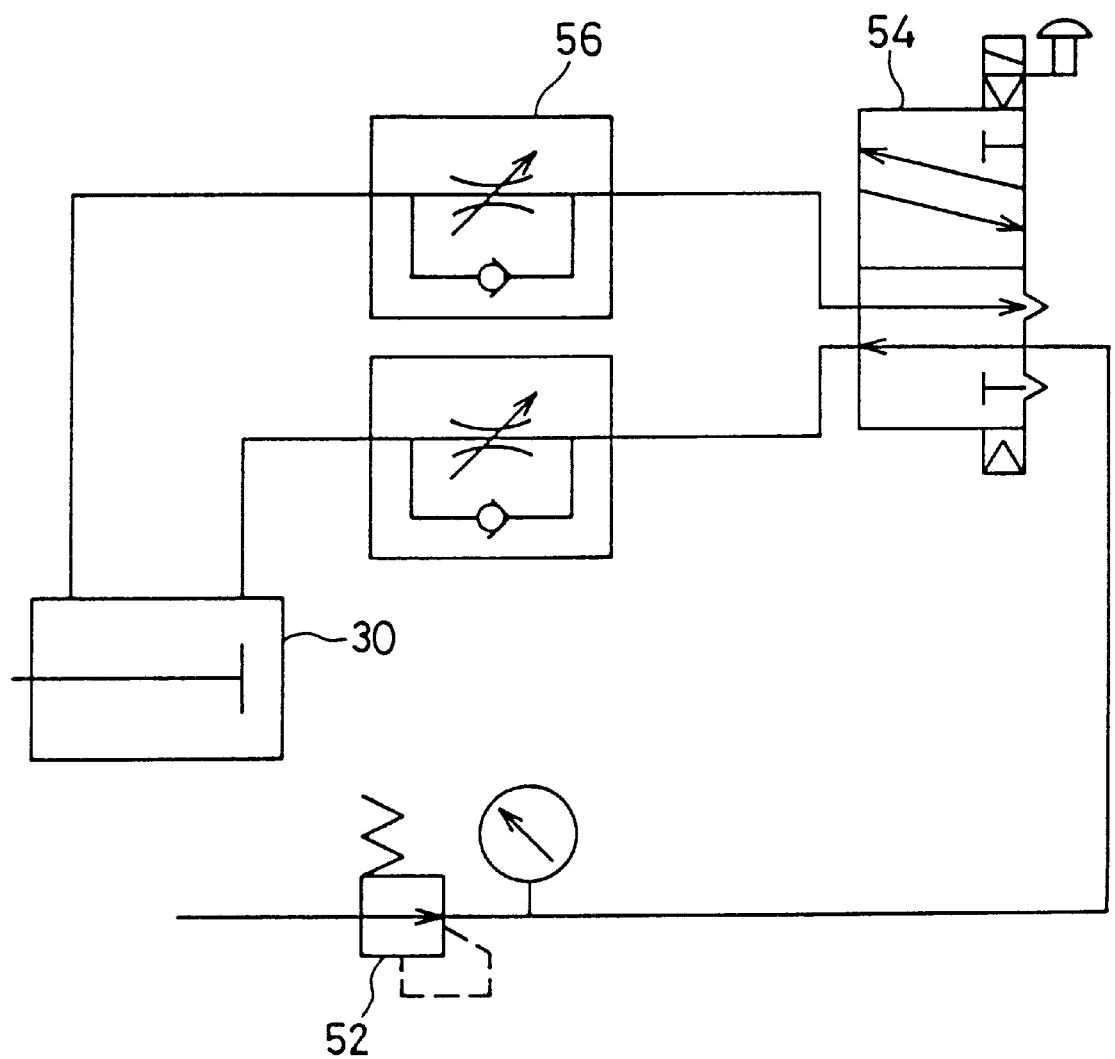
F I G. 5

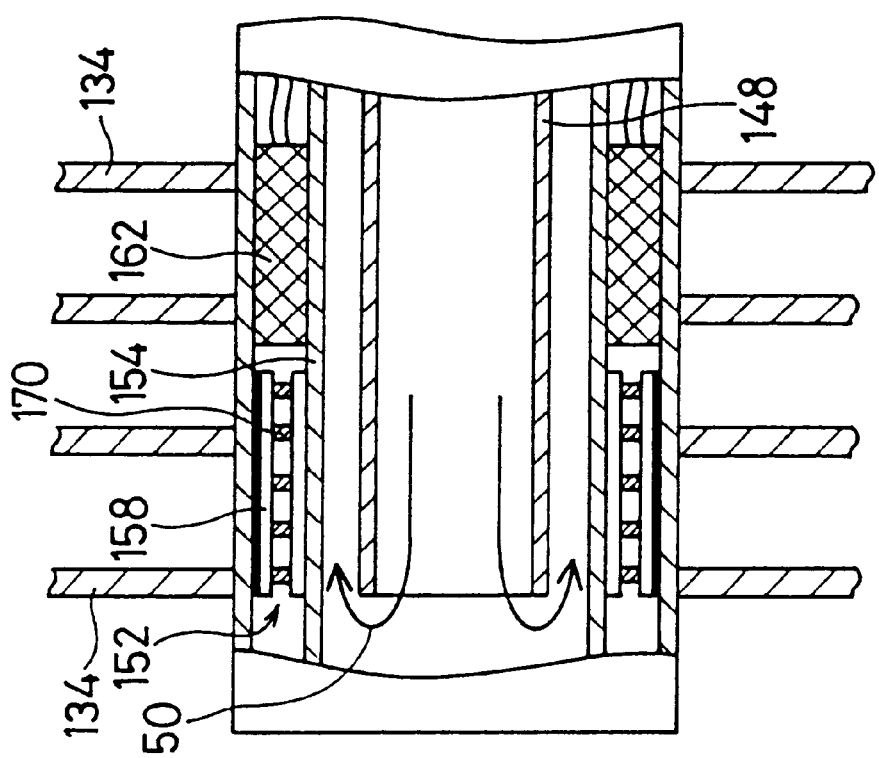
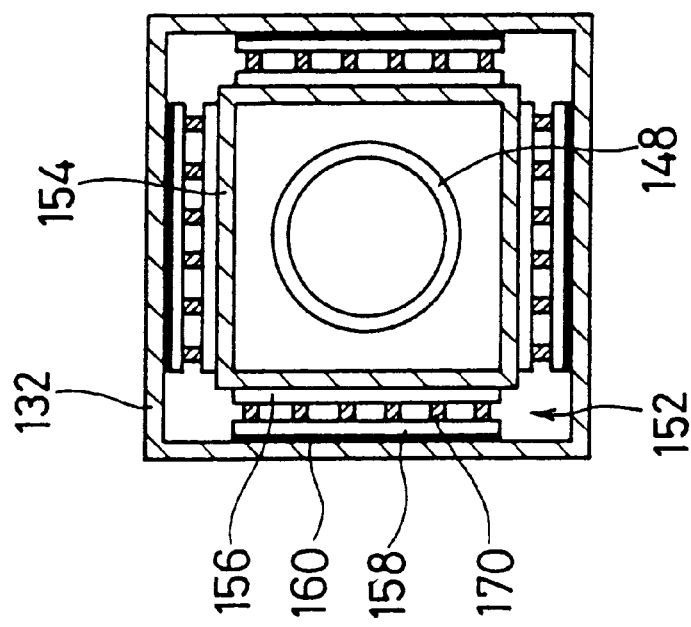

TRAPPING DEVICE AND METHOD OF OPERATION THEREFOR

BACKGROUND OF THE INVENTION

1. Field of the Invention

The present invention relates to a trapping device used in, for example, an evacuation system for evacuating a vacuum chamber in a semiconductor manufacturing apparatus.

2. Description of the Related Art

A conventional evacuation system will be described with reference to FIG. 14. A vacuum chamber 10 is a processing chamber for processing semiconductor devices through processes such as etching or chemical vapor deposition (CVD). The processing chamber 10 is communicated with a vacuum pump 12 through a pipe 14. The vacuum pump 12 is used to raise the gas pressure of the spent gas from the processing chamber 10 to an atmospheric pressure, and in the past, oil-lubricated rotary pumps were common but modern pumps are mainly so-called dry types which do not use any liquid lubricant.

When the degree of vacuum required in the processing chamber 10 is higher than the performance capability of the dry pump 12, an ultra-high vacuum pump such as a turbo-molecular pump is provided upstream of the dry pump. A gas scrubber 20 is provided in a downstream location of the vacuum pump 12, and depending on the characteristics of the exhaust gases, those gases which cannot be exhausted to the atmosphere directly, such as those that are poisonous or explosive, are treated in this device by such processes as adsorption, decomposition and absorption, and only the harmless gases are exhausted into the atmosphere. The pipe 14 is provided with valves in desired locations.

In such conventional vacuum systems, if the reaction byproduct contains a substance having a high sublimation temperature, that substance will leave a solid residue in the process of pressure rise and, in some cases, precipitate in the vacuum pump to cause failure of the pump.

For example, when aluminum is subjected to an etching process, using typical process gases such as $BCl_3$, $Cl_2$, the exhaust gas from the processing chamber 10 will contain a reaction byproduct $AlCl_3$ as well as residual gaseous $BCl_3$ and $Cl_2$.

Among these gases, $AlCl_3$ does not precipitate on the intake side of the vacuum pump where it has a low partial pressure, but while it is being pressurized to raise the partial pressure, it precipitates inside the vacuum pump and the solid particles adhere to the inside wall of the vacuum pump. This phenomenon is a cause of pump failure. Similar problems are encountered when byproducts such as $(NH_4)_2SiF_6$ and $NH_4Cl$ are formed for producing SiN thin film by CVD.

Conventional remedial approaches include:

(1) The vacuum pump is heated to maintain the pump at a high temperature so that the exhaust gas would not precipitate solid particles inside the pump and is eliminated through the pump in a gaseous state.

(2) A water-cooled trap is provided in an upstream location (intake side) of the vacuum pump so as to precipitate potential particles before they enter the vacuum pump.

In the first approach, although it is effective in preventing precipitation inside the vacuum pump, precipitation can still occur in a gas scrubber disposed downstream of the vacuum pump, and the resulting blockages of the filtering layers presented a serious operational and maintenance problems. In the second approach, the system has to be shutdown for cleaning of the traps resulting that the system productivity is sacrificed.

Therefore, it is desirable to be able to trap potential particles in the spent exhaust gas and to regenerate the trap automatically without having to shut down the system. Such a system would assure long service life of the pump, provide protection for gas scrubbers and reduce time loss so that the operational reliability of the manufacturing system will be improved.

One of the important considerations in such an interchangeable trap system is that precipitated particles accumulate in the traps in proportion to the volume of the exhaust gas, and such residues often contain substances that are harmful when sublimated or are expensive and should be recycled. Therefore, it is necessary to provide the regeneration step of separating or removing the particles from the traps in order for reuse of the traps themselves, detoxification, safening or retrieval of precipitate materials.

Conventional trap regeneration processes include an on-site high temperature treatment to vaporize the precipitated particles or neutralization washing process after removing the trap. In the former case, for substances having a high sublimation temperature, it is necessary to elevate the trap temperature, and in some cases, the process of treatment itself poses a high level of danger. If high temperature is applied near to the trap, it creates a situation of having a high-temperature section side-by-side with a low-temperature section. and can lead to operational difficulties, least of which is wasted energy. Additionally, regeneration process by sublimation needs longer period than trapping itself which makes the whole system inefficient. Another problem is that a large storage facility is required for recycling the recovered gases.

On the other hand, trap regeneration process by washing requires many steps such as trap removal, transfer to washing facility and storage of removed traps, and such work is also inefficient. Another problem is that many spare traps must be readied.

It is therefore needed a trapping device in which regeneration process can be performed efficiently and quickly so that the exhausting vacuum pumps and the exhaust treatment device can be operated for longer periods and so that the facility and operating costs for such regeneration processes will be reduced.

Also, in the conventional evacuation system, unreacted feed gas and other process gases are retained in the exhaust gas, and one of the considerations in such a regeneration processes is to recover expensive feed substances, such as gaseous silane. However, the conventional evacuation system is design to introduce all the exhaust gases into the same exhaust treatment device for processing, it is difficult to provide a seperate optimized treatment to each gas. Here, silane is being used to represent monosilane, disilane, dichlorosilane and all other silane group gases of different sublimation temperatures.

Another consideration in developing a new trap treatment process is that the costs of operation and capital for treating all the gases in one treatment device are high because of the large volume of spent gas to be treated and the consequent large scale of the processing facility and complex processing circuits necessary. Therefore, a trapping device and method is desired capable of efficiently trapping and retrieving expensive material such as silane.

SUMMARY OF THE INVENTION

It is an object of the present invention to provide a trapping device that can perform a regeneration operation efficiently so as to raise the overall operational reliability by improving the service life as well as to lower the capital and operation cost of the processing system.

The object has been achieved in a trapping device comprising: an exhaust path for evacuating a spent gas from a hermetic chamber through a vacuum pump; a trap section for trapping component substances from the spent gas flowing through the exhaust path; a cleaning path disposed adjacent to the exhaust path for flowing a cleaning solution for cleaning the trap section; and drive means for transposing the trap section to communicate either with the exhaust path or with the cleaning path.

An appropriate cleaning solution should be selected for resolving and removing the trapped substances, and acqueous solutions including acids, alkalines or pure water are used as well as suitable organic or inorganic solvents. The traps may be saturated with such cleaning solutions, or exposed to a solution stream, or pressure sprayed, or misted. Trapping method may use any processes including chemical reaction, physical adsorption or low temperature trapping. Among those, the low temperature trap provides the most effective trapping action.

According to the trapping device, because regeneration is performed by using cleaning solvent, the process is relatively performed quickly. Therefore, in the system having more than two trap sections, the used trap section may be exchanged with the regenerated trap section, after suitable duration of trap operation so that the system can be operated continually without interruption or trap exchange. Because regeneration process can be performed without elevating the trap temperature, the system construction can be simplified, the capital and operating costs can be lowered, and the system safety is improved. Further, by locating the cleaning path in proximity to the trap treatment facility, cleaning operation can be made more efficient by reducing losses due to transferring of the trap sections or for necessary stocks thereof.

The trap section may be a low-temperature trap to precipitate component substances in the spent gas. The trap section may be provided with the cleaning solution removal device for removing the cleaning solution which may be adhered to the trap section. Such a device employs typically a drying process such as elevated temperature dry air, but it may be preceded by other steps such as rinsing.

The switching device may be constructed to have an arrangement where the trap sections are moved between the paths. In such a case switching between trapping and cleaning can be carried out quickly. The switching device may also be constructed to comprise switching valves located in the cleaning path and the exhaust path. In such a case, less number of mechanical moving components are required so that a simple and compact system can be built.

The object has been also achieved through a method for operating a trapping device comprising the steps of: providing an exhaust path for evacuating a spent gas from a hermetic chamber through a vacuum pump; providing a cleaning path adjacent to the exhaust path; placing a trap section in the exhaust path for trapping component substances in the spent gas by condensing the component substances on the trap section; transposing the trap section to communicate with the cleaning path to perform a regeneration operation on the trap section by washing with a cleaning solution.

Another aspect of the invention is a trapping device comprising: an exhaust path for evacuating a spent gas from a hermetic chamber through a vacuum pump; and a trap section disposed in the exhaust path for removing component substances from the spent gas by condensing the component substances on the trap section, the trap section including a baffle plate disposed so as to contact an exhaust gas stream and a thermoelectric device for cooling the baffle plate operated by inputting an electrical energy.

The thermoelectric device is small and can be easily assembled into the trap section, and the drive power necessary is simply a compressor to deliver liquid nitrogen as a thermal medium or pressurized water, therefore, the apparatus construction is simple and capital cost is low and maintenance is facilitated. Operation is easy, for example, cooling and temperature control can be performed with simple on/off switches.

The baffle plate may be attached in a fin configuration to a shaft member, and the thermoelectric device is provided in interior of the shaft member having a thermal medium passage for flowing a thermal medium for cooling a heat release surface of the thermoelectric device. Such simple configuration is able to carry out cooling quite effectively.

The shaft member may be provided with an electrical heating device for heating the baffle plate so that a simple act of switching of an electrical connection enables to switch between trapping and regeneration operations.

The apparatus may be provided with not less than two trap sections, and each trap is communicable with either the exhaust path for discharging spent gas or a regeneration path for regenerating trap sections. Accordingly, trapping and regeneration operations are carried out alternatingly so that even if the trapped amount exceeds the capacity of one trap section, the system need not be closed or spare traps be readied.

The object has been achieved through a method for recovering silane from a spent gas flowing from a hermetic chamber through an exhaust path comprising the steps of: providing a trapping device having a trap section in the exhaust path; exposing the trap section to a spent gas stream while cooling the trap section to a trap temperature by flowing liquid nitrogen therethrough for precipitating silane on the trap section placing the trap section in a regeneration area having a temperature higher than the trap temperature.

The trap section with circulating liquid nitrogen can cool down to about −200° C. so that any silanes passing through the trapping device can be recovered by condensing on the trap section and recovered in the regeneration section. Therefore, a simple but efficient combination of apparatus and process is effective in recovering silanes for recycling. The exhaust treatment facility is not only simplified by the cost of feed material has been reduced, and significant saving in production cost can be achieved.

The regeneration section is disposed in a regeneration path communicating with the trapping device, and a trapping operation and a regeneration operation are performed concurrently by providing not less than two trapping devices and switching the trap section to communicate with either the exhaust path or with the regeneration path. Accordingly, silane can be recovered without stopping the operation of the whole system.

The regeneration operation may be performed in at least two stages so that high purity silanes can be recovered cost effectively.

Not less than two traps may be provided in the exhaust path so that an upstream trap held at a higher temperature traps component substances with a higher saturation vapor pressure compared with silane-group substances trapped in a downstream trap held at a lower temperature. In such an arrangement, the amount of trapping performed by each trap section can be reduced so that the frequency of switching or replacement can be lowered to improve the trapping efficiency.

The regenerated silane may be recycled through a feed supply line to the hermetic chamber so that the need for new silane can be reduced to lower the feed and operating costs.

Another aspect of the invention is a silane trapping apparatus comprising: a trapping device disposed in an exhaust path for evacuating a spent gas discharged from a hermetic chamber through a vacuum pump; and a trap section disposed in the trapping device for condensing gaseous exhaust substances by flowing liquid nitrogen through the trap section so as to trap silane.

BRIEF DESCRIPTION OF THE DRAWINGS

FIGS. 4A & 4B are enlarged cross sectional views of a shaft provided in the trap section shown in FIG. 1 and the assembled trap section, respectively.

FIG. 5 is a schematic drawing of the drive circuit for the air cylinder.

FIGS. 12A & 12B are other examples of the trapping device shown in FIG. 10.

DESCRIPTION OF THE PREFERRED EMBODIMENTS

Figure 1:
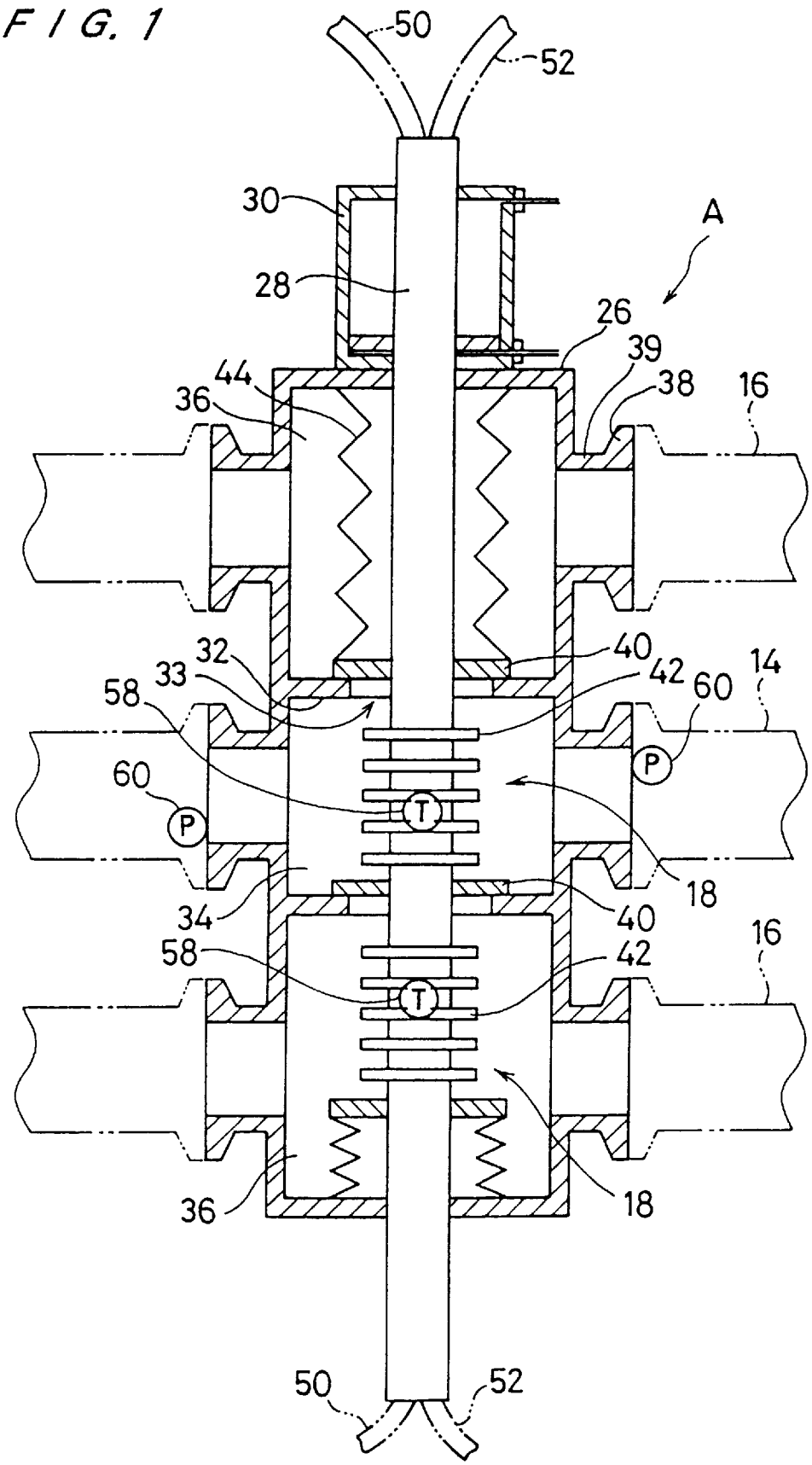
FIG. 1 is a cross sectional view of an embodiment of the trapping device of the present invention.
Figure 2:
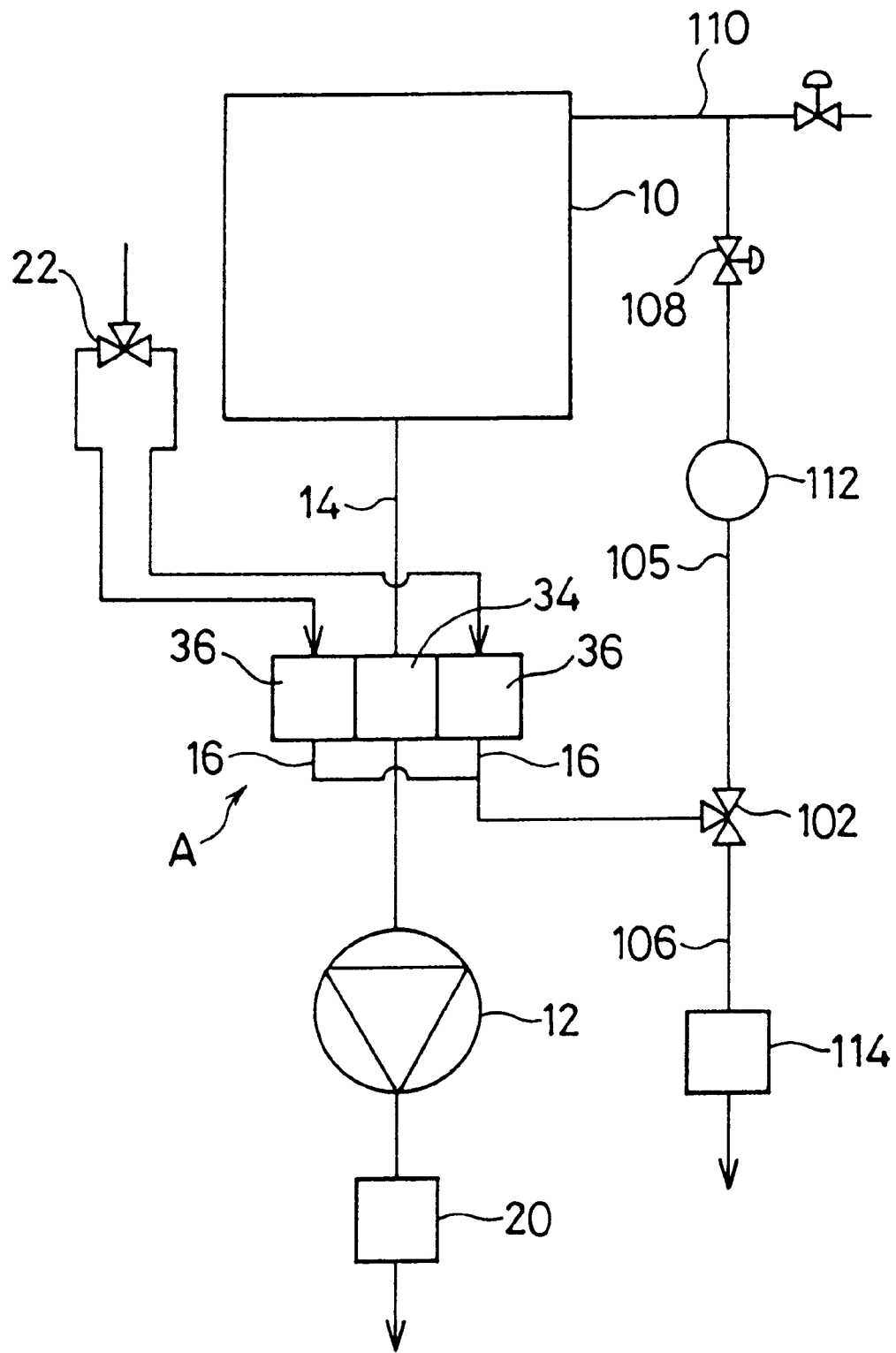
FIG. 2 is a schematic drawing of a vacuum system for use with the trapping device shown in FIG. 1.

A first embodiment of a trapping device A designer for trapping silane will be presented with reference to FIGS. 1–6. As shown in FIGS. 1 and 2, the trapping device A comprises a hermetic chamber 10 and a vacuum pump 12 communicated through an exhaust path 14, and two adjacent regeneration path 16 disposed on the right and left of the exhaust path 14 and two trap sections 18 which are placed so as to be interchangeable by moving in a direction to traverse the exhaust path 14 and the regeneration path 16. The vacuum pump 12 is a single stage pump, but a multi-stage pump may also be used. A gas scrubber 20 is disposed downstream of the vacuum pump 12.

A regeneration gas from a regeneration gas source (not shown) is supplied to the regeneration path 16 for vaporizing the trapped precipitates by heating and transporting the vaporized gas through a branch path and a three-way switching valve 22. The downstream side of the trapping device A in the regeneration path 16 is divided into a recovery path 105 and a discharge path 106 through a three-way switching valve 102, and the recovery path 105 is merged with a feed gas supply path 110 through a flow rate control valve 108. A tank 112 is provided for storing regenerated feed gas in the recovery path 105. Also, the discharge path 106 is provided with a gas scrubber 114.

With reference to FIG. 1, the trapping device A includes a rectangular casing 26 traversing the exhaust path 14 and the regeneration path 16, a transposing shaft 28 transversely crossing the casing 26, and an air cylinder 30 as a drive means for producing a reciprocation motion along the transposing shaft 28. The casing 26 is divided into three spaces in the transverse direction by partition walls 32, into a central trap chamber 34 and two regeneration chambers 36 on both opposite sides, and each chamber has a port connection 39, having a flange 38, to communicate with either the exhaust path 14 or the regeneration path 16.

The transposing shaft 28 has equally-spaced partition plates 40, made of three pieces of a thermal insulating material, and a plurality of baffle plates 42 between the partition plates 40 are integrally fixed to the transposing shaft 28 by welding for instance, to maintain a good thermal conduction therebetween. The partition walls 32 of the casing 26 are provided with a center opening 33, of a size to permit the baffle plates 42 to pass through but not the partition plates 40. A bellows 44 is provided between the two transverse end walls of the casing 26 and the countering two partition plates 40 respectively to maintain hermetic sealing between the regeneration path 16 and the external environment. The contact between the partition wall 32 and the partition plates are made through an O-ring which is similar to the one shown in FIGS. 3A, 3B to maintain hermetic sealing between the trap chamber 34 and the regeneration chamber 36. The partition plate 40 is made of a highly thermal insulating material so as to prevent heat transfer between the trap chamber 34 and the regeneration chamber 36.

Figure 3A:
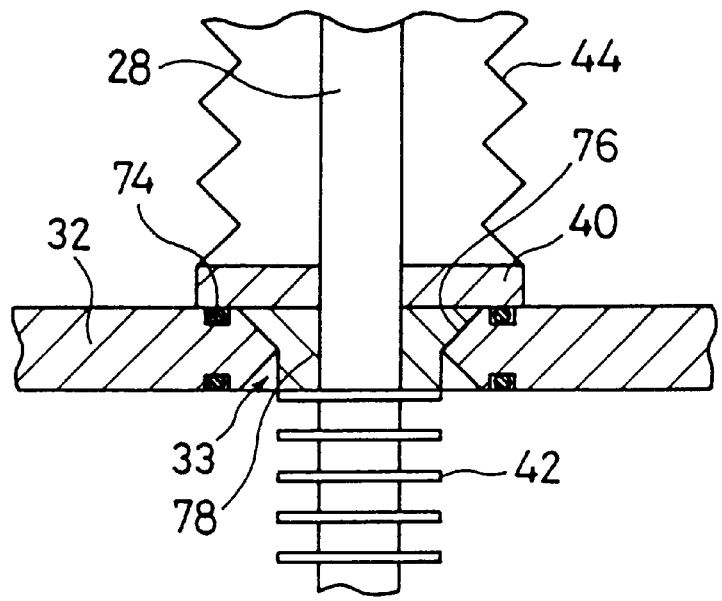
FIGS. 3A & 3B are cross sectional views of another example of the structures of a partition wall and a seal for the trapping device.
Figure 3B:
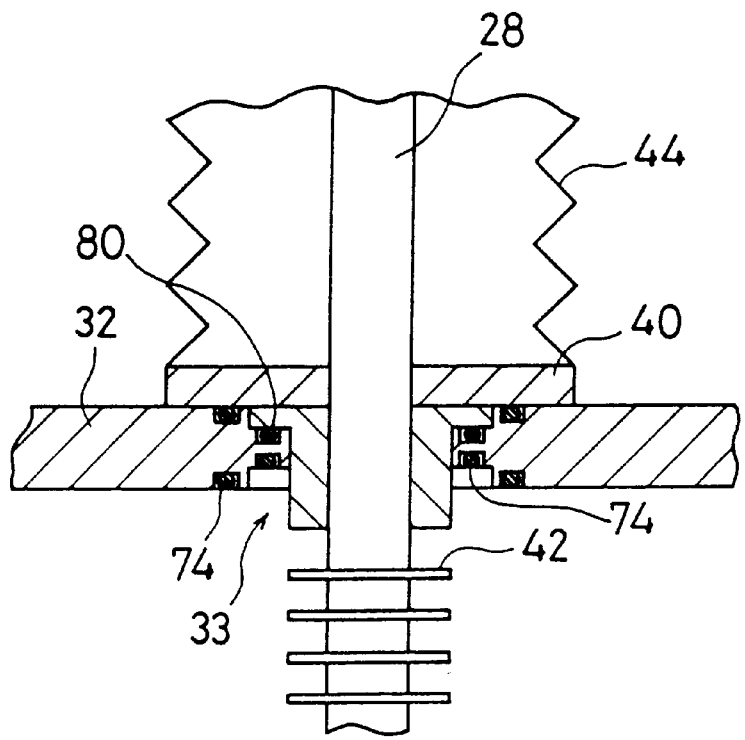

An alternative sealing methods are shown in FIGS. 3A and 3B. In FIG. 3A, the peripheral region of the opening section 33 of the partition wall 32 is made into a tapered surface 76, and an elastic packing 78 is provided on the partition plate 40 to seal against the tapered surface 76. A hermetic sealing is produced by the action of the tapered surface 76 bearing against the elastic packing 78. If the durability of the sealing parts is important, a harder substance such as a metallic packing may be used. FIG. 3B shows a type of sealing provided by a stepped section 80 formed on the periphery of the opening section 33 with an intervening O-ring 74 for enhancing the sealing effect.

As shown in FIG. 4A, the transposing shaft 28 is a cylindrical element made of a good thermal conductivity material, and its interior space is closed off with a central partition plate 40. The transposing shaft 28 has an inner tubes 46 inserted from both ends of the transposing shaft 28 into the vicinity of the central partition plate 40, as shown in FIG. 4B. The space between the two tubes constitutes a thermal medium passage 48 for a thermal medium to enter into the inner tube 46 and, upon hitting the central partition plate 40, to return through the outer space to the outer end of the shaft 28.

The cooling medium, liquid nitrogen, is supplied from a supply hose 50, circulated through the thermal medium passage 48 and discharged from a discharge hose 52 connected to each end of the transposing shaft 28. of the two thermal medium passages 48 connected to the ends of the transposing shaft 28, only one passage connected to the trap chamber 34 having the baffles 42 is used for delivering the liquid nitrogen, and liquid nitrogen is shut off from the other passage connected to the regeneration chamber 36 and may be used instead to deliver a heating medium. In this example, the hoses 50, 52 are connected to the end of an air cylinder, and therefore, it requires less space than a case of connecting them between the air cylinder 30 and the casing 26.

FIG. 5 shows the piping arrangement for delivering air pressure to the air cylinder 30. The air pressure from an air source is reduced in a regulator 51, and is used to operate the cylinder 30 to move the piston (not shown) forward or backward according to electromagnetic switching signals generate by a solenoid valve 54. The speed of the air cylinder 30 is regulated by a speed controller 56. The solenoid valve 54 is controlled by control signals from, for example, sequencer or relay, and in this case, it exchanges the traps after a predetermined period of time of operation of the trap.

A temperature sensor 58 is provided in a suitable location at the baffles 42 in the trap section 18, and pressure sensors may be provided in fore- and aft-locations of the trap section 18 in the exhaust path 14. These sensors enable to indirectly monitor the trap performance based on temperatures and pressures. The temperature sensor 58 can also be used to control regeneration of feed material by differentiating separation parameters of the feed material from those of other precipitation products.

Next, the process of trapping silane using the trapping device A will be described. When the trap is positioned as shown in FIG. 1, liquid nitrogen is supplied from the supply hose 50 through the thermal medium passage 48 to the trap section 18 positioned in the trap chamber 34. This action cools the baffles 42 through the transposing shaft 28 to about −200° C. Therefore, a large portion of the exhaust gas elements including silane are precipitated in the trap chamber 34 and adheres to the baffles 42.

Figure 6:
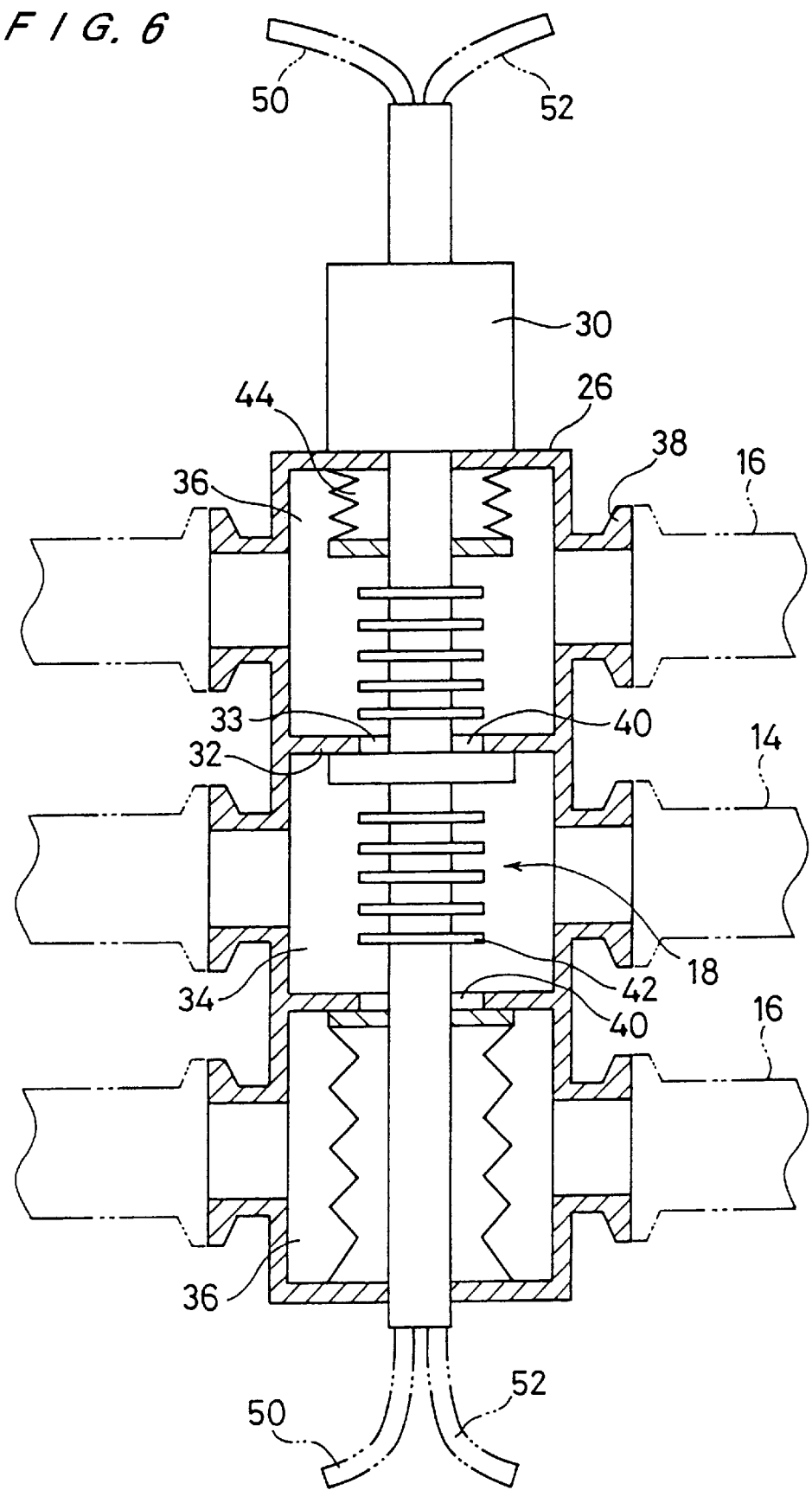
FIG. 6 is a cross sectional view of the trap after a switching operation.

After a certain period of trap operation, the air cylinder 30 is activated, which changes the position of the trap section from that shown in FIG. 1 to that shown in FIG. 6, i.e., the trap section 18 regenerated in the other regeneration chamber 36 is transposed to the trap chamber 34. Regeneration operation in the regeneration chamber 36 is carried out in two steps.

First, the temperature of the trap chamber 34 is raised from −200° C. to −120° C. and is maintained at this temperature for some time. One method is to control the flow rate of liquid nitrogen flowing through the thermal medium passage 48 (in this case lower the flow rate). By doing so, only those silanes having sublimation temperatures in the range of −120−−180° C. will be selectively evaporated, and are transported downstream in the regeneration path. In this case, the three-way switching valve 102 is opened to the recovery path 105 so that the silane can be stored in tank 112 or merged into the feed gas (silane) supply path 110 to be circulated to the hermetic chamber 10. Liquid nitrogen is flowing in tank 112, and silanes are liquefied on the piping, and are stored in a liquid silane state. Although not illustrated, necessary silane refining facilities are provided.

Next, the three-way valve 102 is opened to the discharge path 106 to shut off the liquid nitrogen flow in the thermal medium passage 48, and using a technique of flowing either an elevated temperature medium (less than the ignition temperature of the silane being processed) or a regeneration gas at about 10° C. higher than the sublimation temperature, the temperature is raised on the transposing shaft 28 and baffle plates 42. This step releases all the trapped residues other than silanes, and the regeneration process of the trap section 18 is completed. Regeneration gas and evaporation gas are detoxified or safened in the gas scrubber 114 and are discharged into the atmosphere. By conducting the above processes by monitoring with temperature sensors 58 provided on the trap section 18, it is possible to separate silanes and regeneration gas with high accuracy.

In carrying out the processes presented above, because the partition plate 40 is made of a thermal insulating material to thermally isolate the trap chamber 34 and the regeneration chamber 36, there is little loss of thermal energy and trapping and regeneration operations can be carried out quite efficiently. Also, because the regeneration chamber 36 and the transposing shaft 28 are hermetically sealed with the bellows 44, thermal energy loss as well as loss of processing efficiency cause by heat transfer between the chamber 38 and the external environment through the air cylinder 30 are minimized. This arrangement assures stable trapping and regeneration operations as well as prevention of infiltration of contaminating elements into the exhaust path 14.

Temperature sensor 58 provided in the trap section 18 and pressure sensor 60 provided in the exhaust path 16 allow monitoring of operating conditions inside the trap chamber so that, should an abnormal condition develops, a warning signals can be released to take quick remedial steps. For example, an abnormal increase in the temperature of the trap section 18 or an increase in the pressure difference would indicate an increase in thermal load due to the deposition of precipitates. Such a warning can be dealt with, for example, by exchanging the trap even before its allotted time is expired. of course, such warning signals may be used for basis for switching the trap sections 18.

Figure 7:
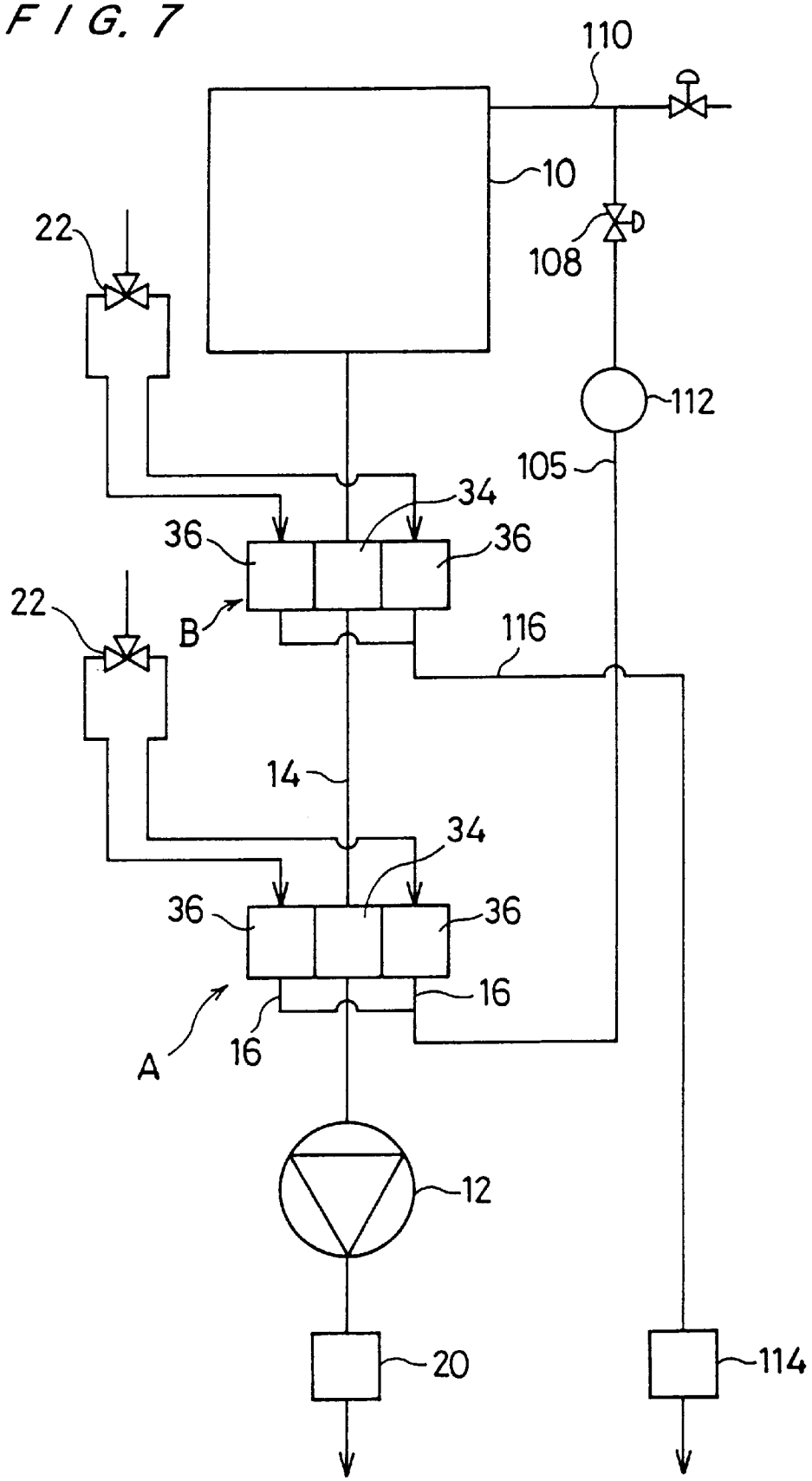
FIG. 7 is a schematic overall view of another embodiment of the vacuum system of the present invention.

FIG. 7 shows an arrangement of placing a fore-stage trapping device B in an upstream location of the trapping device A, operating at a slightly higher temperature to trap gaseous components other than silanes. This fore-stage trapping device B is constructed similarly to trapping device A, but the temperature of the thermal medium is chosen to be the highest possible temperature limit that can prevent precipitation of silanes, for example, −170° C. for monosilane. Regeneration path 16 of the trapping device A is communicated with the downstream silane supply path 110 through the recovery path 105, tank 112 and the flow control valve 108, and the regeneration path 116 of the trapping device B is communicated with the downstream gas scrubber 114.

The apparatus of this embodiment traps silanes separately from all other gases so that one regeneration operation suffices in each of the traps A and B to provide quick processing. This feature is useful, because regeneration processes are generally more time consuming than trapping processes, and is an important factor in minimizing the time loss caused by waiting for the trapping process to be applied.

Figure 8:
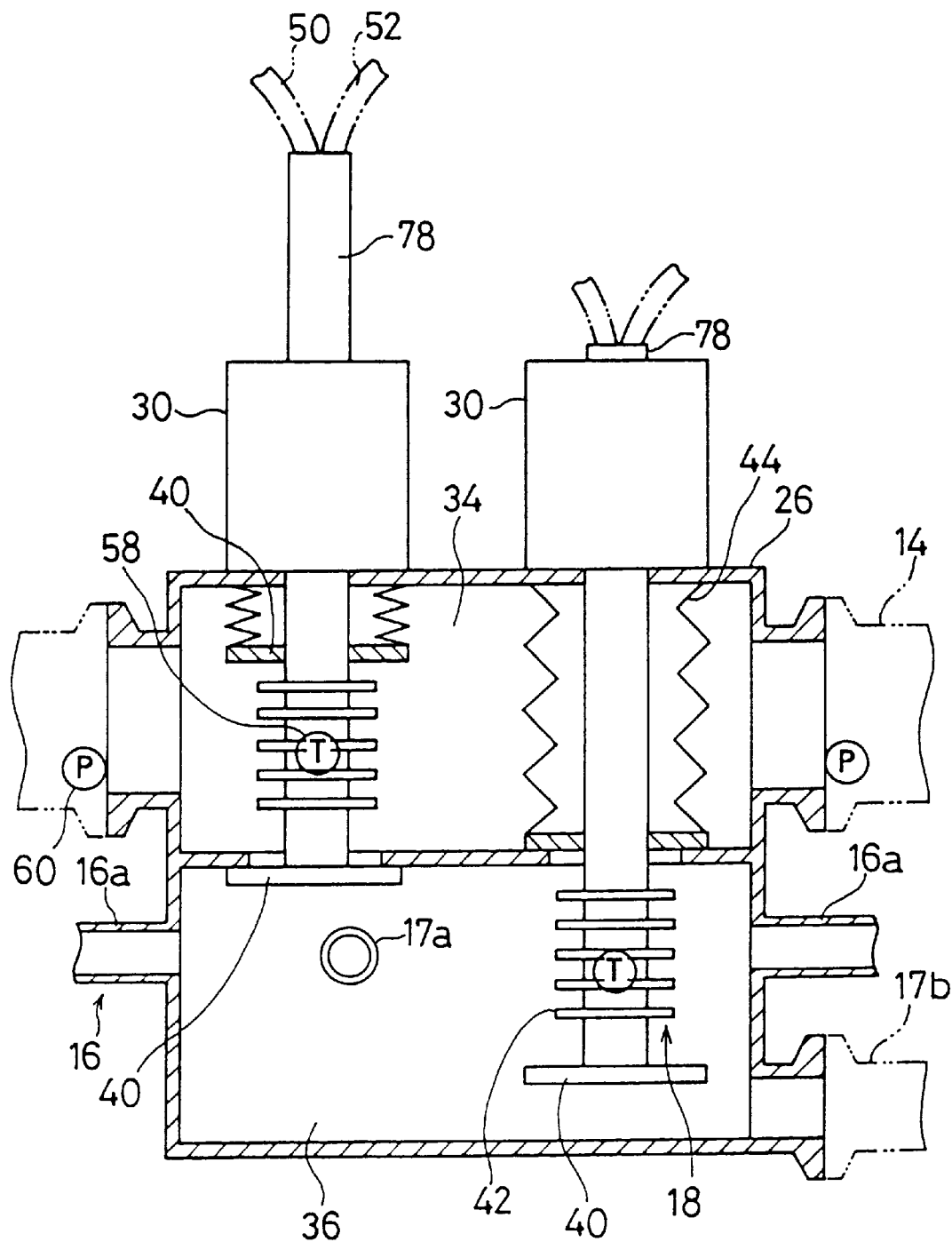
FIG. 8 is a cross sectional view of another example of the trapping device of the present invention.
Figure 9:
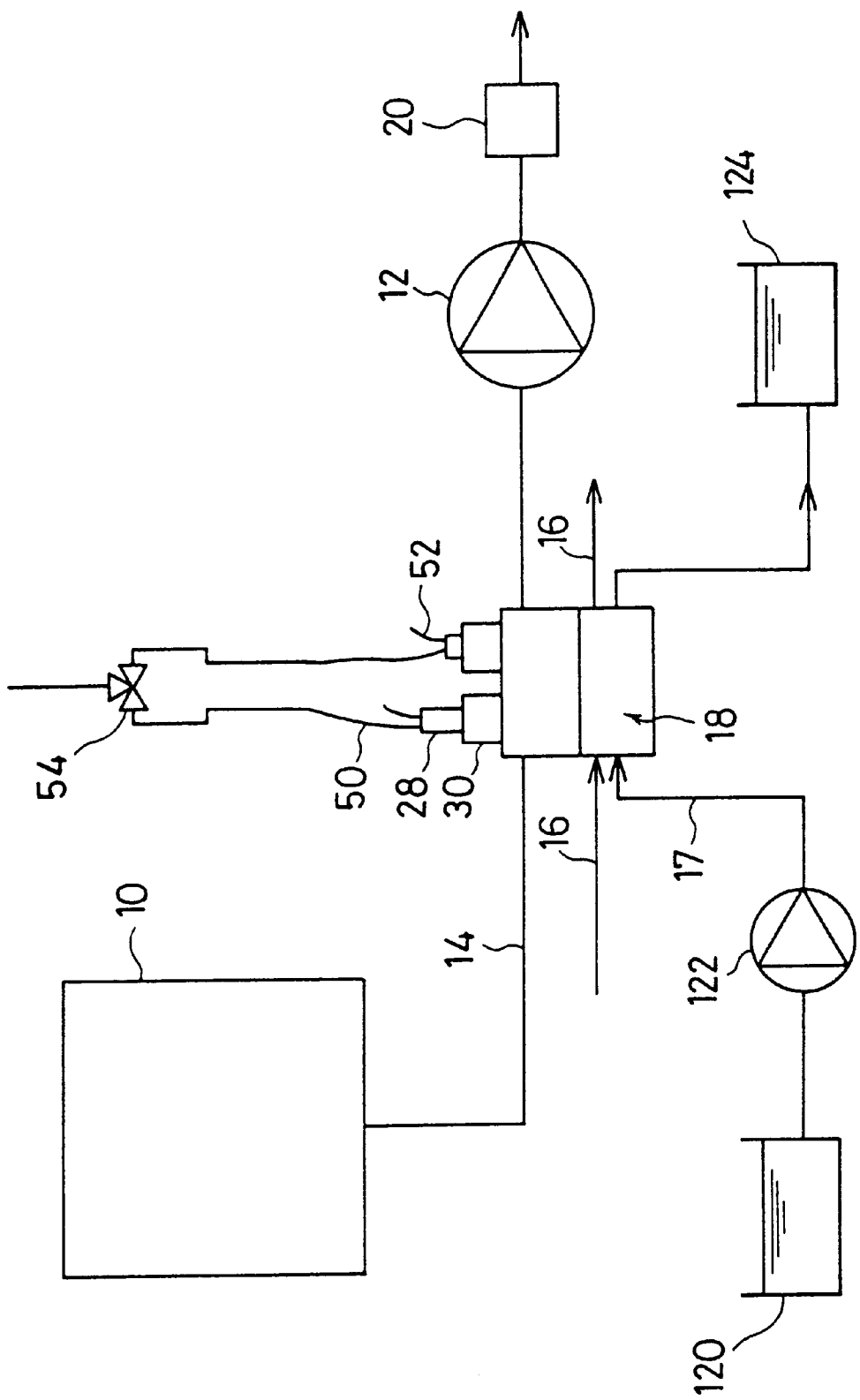
FIG. 9 is an overall view of a vacuum system incorporating a washing apparatus shown in FIG. 8.

FIGS. 8 and 9 show another embodiment of the invention having a plurality of trap sections 18 arranged in series in the exhaust direction. In this case, a regeneration path 16 and a cleaning path 17 are arranged in parallel downstream of the exhaust path 14. The casing extends in the exhaust direction and is provided with a plurality of transposing shafts (two in the drawing) to produce a reciprocating motion by air cylinder. One transposing shaft is assigned to each trap section 18, and each trap section 18 can be independently transferred to either a trap chamber 34 or a regeneration chamber 36.

As shown in FIG. 9, the cleaning path 17 includes a storage tank 120 for storing a cleaning solution and a compressor or a pump 122 for pressure delivery of the cleaning solution, and downstream of the trapping device, a recovery tank 124 is provided for storing the spent solution. In this embodiment, the cleaning path 17 is connected to two upper inlet openings 17a of the cleaning chamber 36, and by means of a switching valve (not shown), the cleaning solution is introduced into the trap section in a cleaning position, and is discharged through the lower outlet 17b. If the cleaned trap section is to be dried, a dryer gas source may be connected to either the regeneration path 16 or the cleaning path 17, or to separate sets of inlet and/or outlet openings assigned therefor.

Although this system operates in the same way as the previous apparatus by interchanging the trap section 18 to either the trap chamber 34 or the regeneration chamber 36, this system is advantageous because only one regeneration path is required so that the apparatus may be made more compact. It presents a flexibility that the number of trap sections 18 can be adjusted depending on the operational requirement of the system. For example, if the exhaust volume or precipitation volume increases suddenly, regeneration process can be stopped temporarily so that both trap sections can be placed in the trapping position. This advantage is multiplied by utilizing at least three trap sections. This is because the choice of placing the trap sections in either regeneration or trap position is significantly increased.

The operational procedure of this system is different from the previous system because the second stage of regeneration, i.e., removal of components other than silanes is carried out by washing with a cleaning solution. After completing the regeneration process for silanes in the regeneration chamber 36 shown in FIG. 8, a suitable cleaning solution (refer to Table 1) for dissolving the adhering substances is introduced through the inlet opening 17a and is discharged through the outlet 17b. As necessary, the process may be repeated, solution may be sprayed or the cleaning chamber 36 may be filled with the cleaning solution. Or, the cleaning solution may be changed to another type to conduct additional cleaning steps or rinsing steps. To avoid infiltration of the cleaning solution into the vacuum pump and peripheral devices, the trap sections are dried with a drying gas.

TABLE 1

| Process | Product Example | Solubility | | |
| --- | --- | --- | --- | --- |
| | | Pure water | Acid | Alkaline |
| P-CVD | (NH$_4$)SiF$_6$ | o | o | o |
| LP-CVD | NH$_4$Cl | o | o | o |
| AL etcher | AlCl$_3$ | o | o | o |
| SiO$_2$ etcher | CF compd | x | x | x |
| Poly-Si | W-Cl compd | x | x | o |
| etcher | Fe-Cl compd (corrosive) | x | x | x |
| LC etcher | TaF$_5$ | o | Δ | Δ |
| Ion Implantation | P | x | Δ | o |
| Ion Implantation | P$_2$O$_5$ | o | o | o |
| Ion Implantation | As | x | o (nitric acid) | x |

TABLE 1-continued

| Process | Product Example | Solubility | | |
| --- | --- | --- | --- | --- |
| | | Pure water | Acid | Alkaline |
| W-CVD | W (W compd) | x | x | o |
| B-D-Poly | Si compd | x | x | o | o: soluble
Δ: difficult
x: not soluble

Note: If a product contains Si-compound, it is soluble in alkaline solution but only partially soluble in pure water and acid.

Such a regeneration apparatus based on cleaning solutions does not require to have the regeneration (cleaning) chamber 36 operate at elevated temperatures, therefore, measures to prevent heating affecting the performance of the trap chamber 34 can be minimized. Also, compared with the regeneration approach based on evaporating the precipitates, the regeneration capacity as well as processing speed are higher. Furthermore, compared with the evaporation approach, post-processing treatments are simpler, and especially, recycling of regenerated substances and storage are more convenient.

Also, the configuration shown in FIG. 8 has the washing chamber 36 disposed below the trap chamber 34, so that there is no danger of the cleaning solution seeping into the trap chamber 34, and therefore, this type of arrangement is most suitable for regeneration using solutions. However, if the sealing can be assured, both the trap chamber 34 and the washing chamber 36 can be arranged laterally. For example, a compact trapping device may be produced by providing left and right cleaning paths to surround two trap sections and using one air cylinder to switch the two traps. Also, safety measures should be provided for possible power failures so as to prevent the apparatus from stopping while transposing the baffles or from creating a situation of having the cleaning solution seeping into the process gas path.

Figure 10:
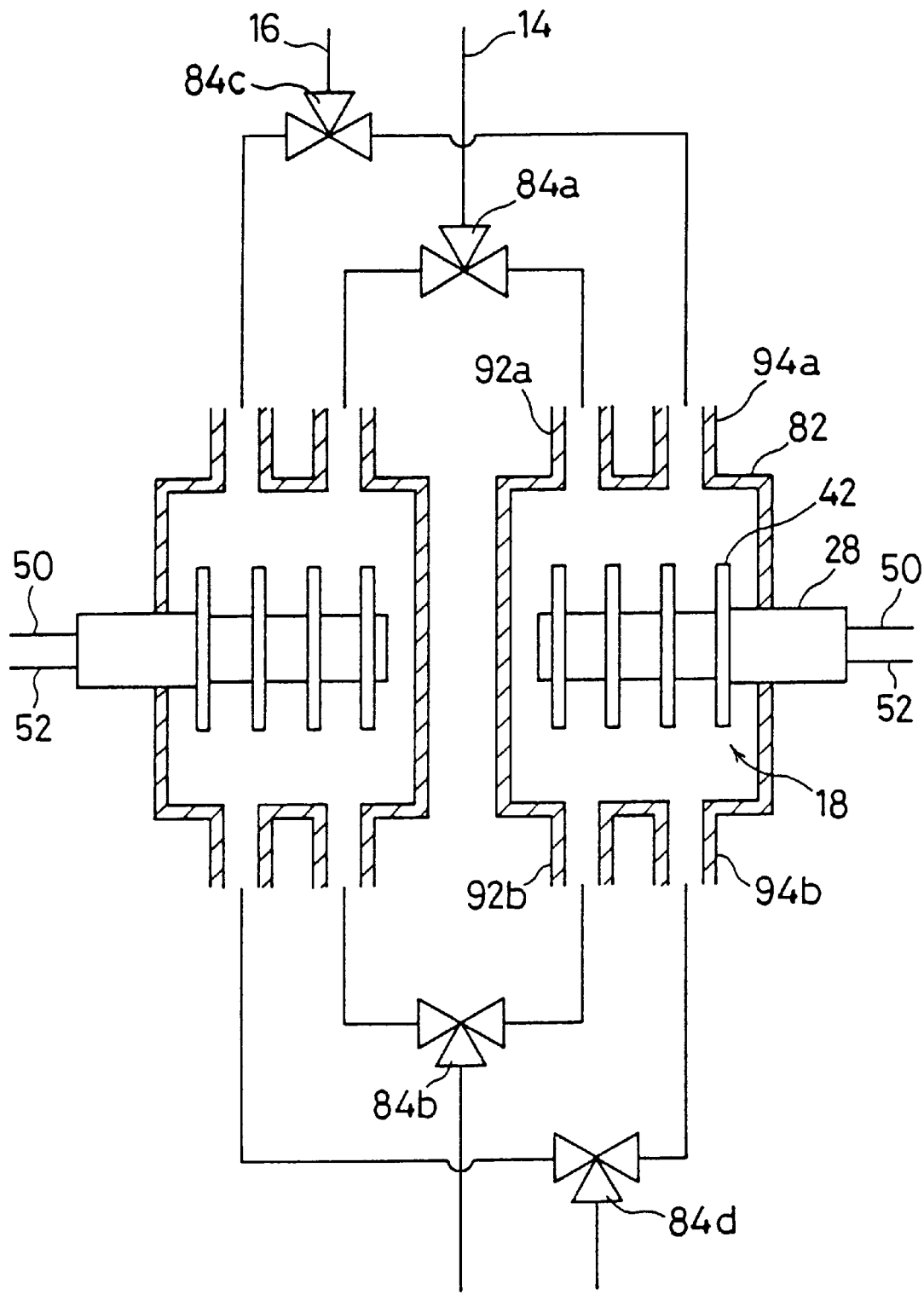
FIG. 10 is a cross sectional view of another embodiment of the trapping device.
Figure 11:
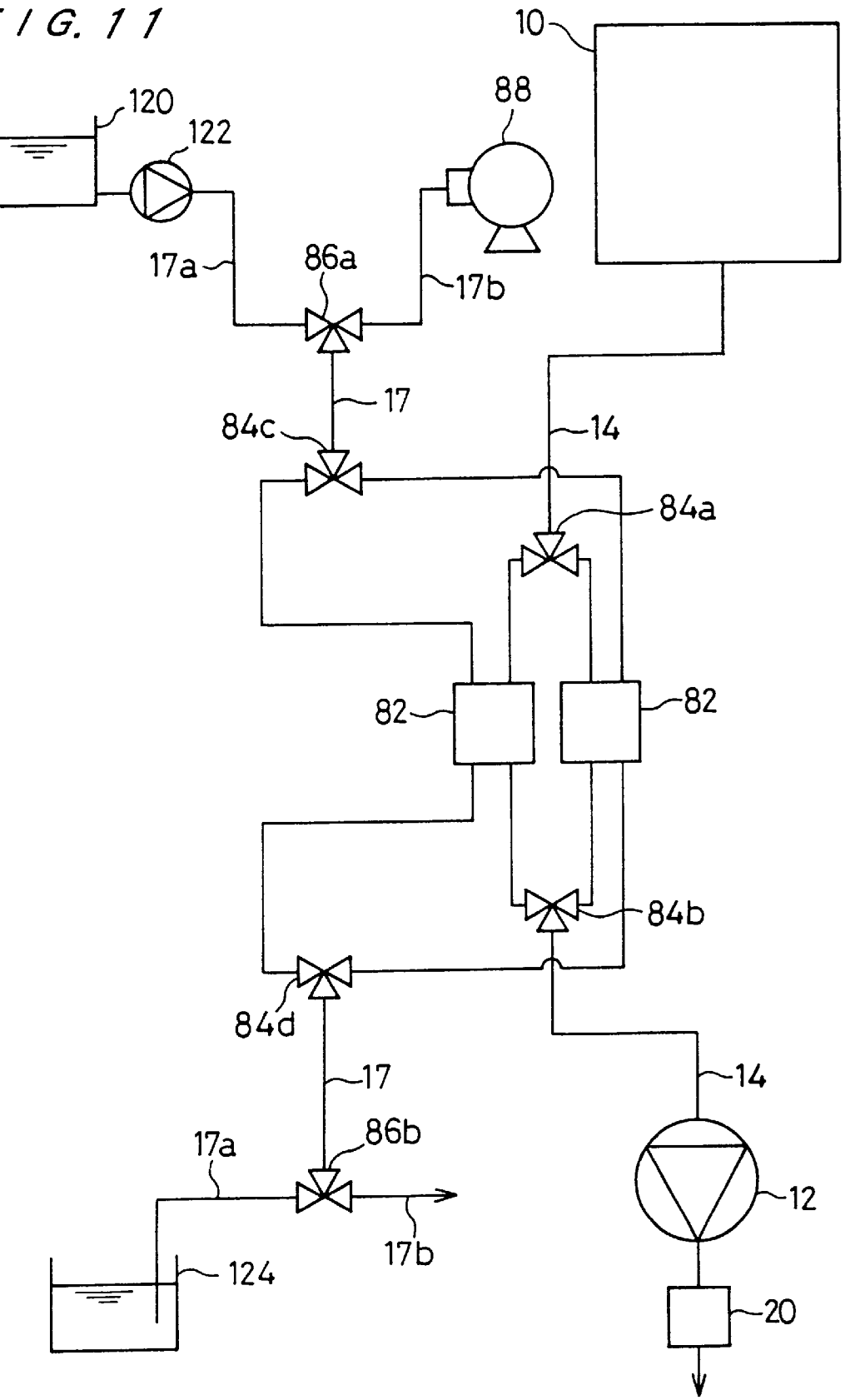
FIG. 11 is an overall view of a vacuum system incorporating a washing apparatus shown in FIG. 10.

FIGS. 10 and 11 show another embodiment of the invention. In this system, the cleaning path 17 is provided adjacent to the exhaust path 14 communicating the chamber 10 and the vacuum pump 12. Each path is provided with a casing 82 having a trap section 18 so that the exhaust path 14 and the cleaning path 17 can be switched by means of three-way switching valves 84a, 84b, 84c and 84d. The cleaning path 17 has an upstream three-way valve 86a and a downstream three-way valve 86b and is branched into a solution path 17a for flowing a cleaning solution and a dryer path 17b including a blower 88.

Each trap section 18, as shown in FIG. 10, is disposed so that the transposing shaft 28 traverses the flow direction inside the hermetic casing 82, and fin-shaped baffle plates 42 are attached to the transposing shaft 28. The casing 82 has an inlet 92a and an outlet 92b for the exhaust path 14, an inlet 94a and an outlet 94b for the cleaning path 17. The construction of the baffles 42 is basically the same as that presented earlier, and description will not be repeated.

This system operates by serially switching the three-way valves 84a, 84b, 84c and 84d between the trapping and cleaning operations, and at the same time, a cooling medium is chose for the thermal medium supply pipes 50, 52. The cleaning steps are, first, the three-way valves 86a, 86b are switched to the cleaning path 17a to perform cleaning by flowing a cleaning solution from the storage tank 120. Next, dryer path 17b is connected so that the trap can be dried by flowing dry air supplied from the blower 88. If the washing step does not produce any detrimental effects to the chamber 10 or the vacuum pump 12, the drying step may be omitted.

FIG. 12 shows another way of cooling the baffles in the trapping device shown in FIG. 10. The space between the transposing shaft 132 and the inner tube 148 is provided with a cooling device 152 based on a thermoelectric cooling device (Peltier device). A radiation tube 154 is provided between the transposing shaft 132 and the inner tube 148, and the radiation plates 156 of the cooling device 152 is attached to the radiation tube 154, and the cooling plates 158 are attached to the transposing shaft 132 with a spacer 160 made of a highly thermally conductive material such as indium. Within the same space as the cooling device, a heater 162 for regeneration process is also provided.

Figure 13:
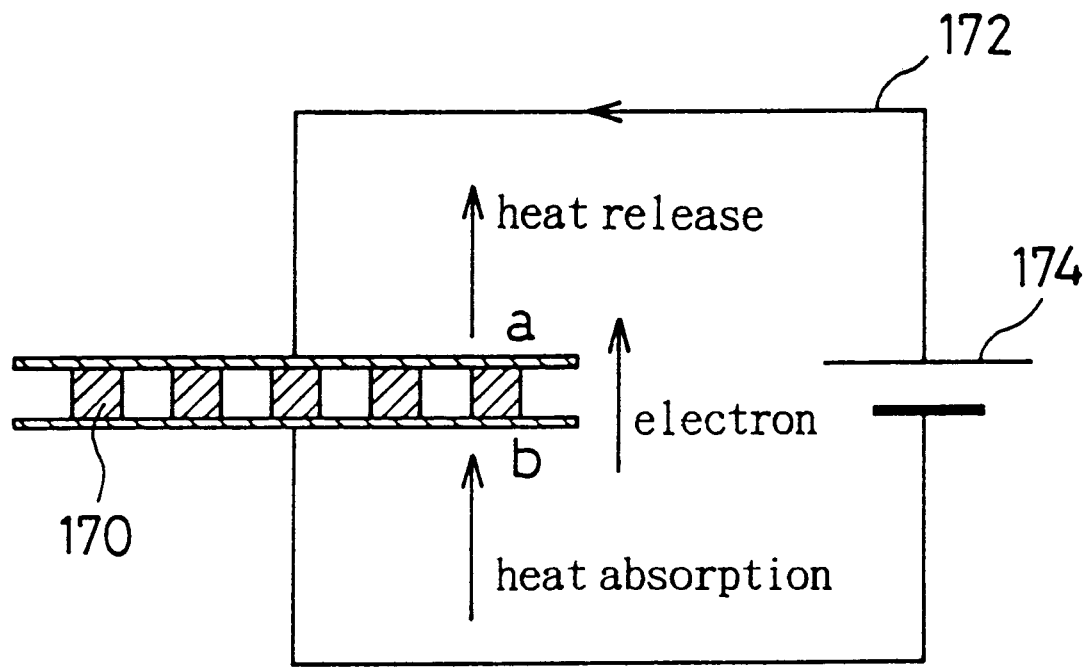
FIG. 13 is a drawing of a thermocouple.
Figure 14:
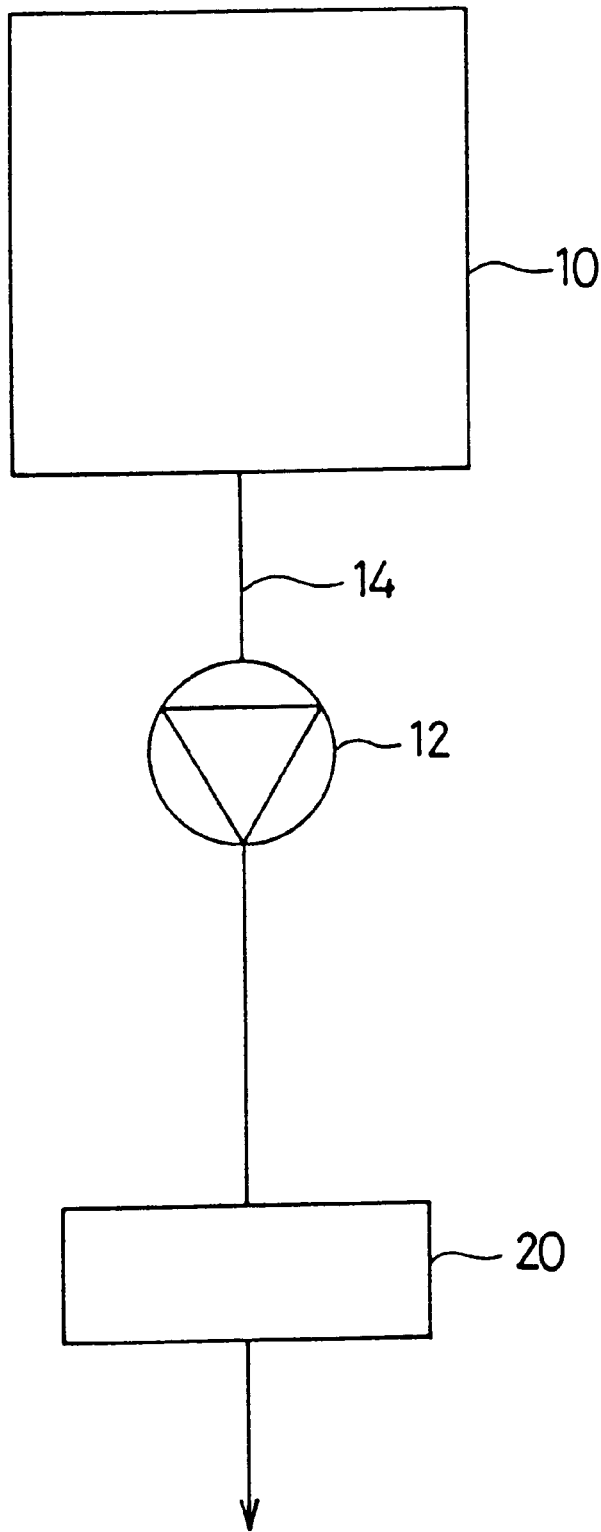
FIG. 14 is a schematic drawing of a conventional vacuum system.

The thermoelectric device is an electrical current-driven device, as shown in FIG. 13, and performs cooling by flowing a D.C. current through lead wires 172 into a series of semiconductor elements 170 held between two metallic plates. When a current is flowed through the semiconductor elements 170 from a D.C. source 174, the electrons flow in the opposite direction, and a temperature difference is generated between the two plates. The Peltier effect produces a heat release on the a-side plate and a heat absorption on the b-side plate. By cooling the heat release side with gaseous nitrogen or water, a temperature of about −30° C. is generated on the b-side.

A low temperature of about −30° C. can be easily obtained with the use of such a simple arrangement of wiring for energy supply and heat discharge through heat medium such as nitrogen or water. Thermoelectric element is compact and can easily be accommodated in the trap section in the exhaust path, and the only essential drive component is a compressor for pressure delivery of a thermal medium such as nitrogen gas or water so that the trap system is simple, installation cost is low and maintenance is easy. Operation is uncomplicated involving relatively simple cooling and on/off temperature control, for example.

In this system, the trap section is operated by turning on the power switch for the thermoelectric device 170 to operate the cooling device 152 and simultaneously, a cooling medium such as gaseous nitrogen is flowed in the thermal medium passage 50. The radiation plate 156 is then essentially maintained at about room temperature, and the cooling plate 158 is cooled to a temperature lower than room temperature, which is determined by the capability of the thermoelectric device 170. The degree of cooling can be adjusted by altering the current flowing through the device 170.

When trap regeneration is required after a given period of operation of the system, the three-way switching valves 84a, 84b, 84c and 84d in the exhaust path 14 and the regeneration path 16 are operated, and the trap section 18 is transposed. When regeneration operation is being undertaken, the cooling medium in the thermal medium passage 50 is shut off, and the heater 162 is activated. Because cooling and heating require only electrical energy, this trapping device can be made in a simple construction and the electrically controlled system enables total control over the entire system with simple arrangement of switches in conjunction with controllers. The gaseous substances generated by regeneration process is discharged through the exhaust path 16 to be treated in the gas scrubber (not shown). Also, the cooling/heating effects can be reversed by reversing the polarity of the D.C. source, therefore, the heater 162 can be eliminated by employing polarity switching on the power supply.

It is clear that the electrical cooling/heating approach shown in FIG. 12 can also be applied to the trapping device shown in FIG. 1 or 8.

What is claimed is:

1. A method for operating a trapping device comprising the steps of:

providing an exhaust path for evacuating a spent gas from a hermetic chamber through a vacuum pump;

providing a cleaning path adjacent to said exhaust path;

placing a trap section in said exhaust path for trapping component substances in said spent gas by condensing said component substances on said trap section, said trap section comprising a shaft portion connected to a drive means and a baffle portion fixed to said shaft portion;

transposing said trap section to communicate with said cleaning path to perform a regeneration operation on said trap section by washing with a cleaning solution; and hermetically sealing a housing crossing over said exhaust path and said cleaning path for defining a trap chamber and a cleaning chamber therein, said trap section being movable between said trap chamber and said cleaning chamber.

2. A method for recovering silane from a spent gas flowing from a hermetic chamber through an exhaust path comprising the steps of providing a trapping device having a trap section in said exhaust path;

exposing said trap section to a spent gas stream while cooling said trap section to a trap temperature by flowing liquid nitrogen therethrough for precipitating silane on said trap section; and placing said trap section in a regeneration area having a temperature higher than said trap temperature, wherein said regeneration area is disposed in a regeneration path communicating with said trapping device, and a trapping operation and a regeneration operation are performed concurrently by providing at least two trapping devices and transposing said trap section to communicate with either said exhaust path or with said regeneration path, and said regeneration operation is performed in at least two stages so that a plurality of saline species are recovered through a temperature-graded process.

3. A method according to claim 2, wherein regenerated silane is recycled through a feed supply line to said hermetic chamber.

4. A method for recovering silane from a spent gas flowing from a hermetic chamber through an exhaust path comprising the steps of providing a trapping device having a trap section in said exhaust path;

exposing said trap section to a spent gas stream while cooling said trap section to a trap temperature by flowing liquid nitrogen therethrough for precipitating silane on said trap section; and placing said trap section in a regeneration area having a temperature higher than said trap temperature, wherein at least two trapping devices are provided in said exhaust path so that an upstream trapping device is held at a higher temperature traps component substances with a higher saturation vapor pressure compared with silane trapped in a downstream strap held at a lower temperature.

5. A trapping device comprising:

an exhaust path for evacuating a spent gas from a hermetic chamber through a vacuum pump;

a trap section for trapping component substances from said spent gas flowing through said exhaust path;

a cleaning path disposed adjacent to said exhaust path for flowing a cleaning solution for cleaning said trap section; and drive means for switchingly transposing said trap section to communicate either with said exhaust path or with said cleaning path;

a hermetically sealed housing crossing over said exhaust path and said cleaning path for defining a trap chamber and a cleaning chamber therein, said trap section being movable between said trap chamber and said cleaning chamber, wherein said trap section comprises a shaft portion connected to said drive means and baffle portion fixed to said shaft portion.

6. A trapping device according to claim 5, wherein said trap section is a low temperature trap for precipitating component substances from said spent gas by cooling.

7. A trapping device according to claim 5, wherein said trap section is provided with cleaning solution removal means for eliminating said cleaning solution adhering to said trap section.

8. A trapping device according to claim 5, wherein said shaft portion comprises a cooling means for cooling said baffle portion.

9. A trapping device according to claim 5, further comprising a partition plate for operatively providing a sealing between said trap chamber and said cleaning chamber.

10. A trapping device according to claim 5, further comprising a flexible closure member for providing a sealing between said trap sections and said housing.

11. The trapping device according claim 5, wherein said trap section is disposed in said exhaust path for removing component substances from said spent gas by condensing said component substances on said trap section, said trap section including a baffle plate disposed so as to contact an exhaust gas stream and a thermoelectric device for cooling said baffle plate operated by inputting an electrical energy.

12. A trapping device according to claim 11, wherein said baffle plate are attached in a fin configuration to a shaft member, and said thermoelectric device is provided in interior of said shaft member, said shaft member having a thermal medium passage for flowing a thermal medium for cooling a heat release surface of said thermoelectric device.

13. The trapping device according to claim 11, wherein said trap section is provided with an electrical heating device for heating said baffle plate.

14. The trapping device according to claim 5, wherein a trap section is disposed in said trapping device for condensing gaseous exhaust substances by flowing liquid nitrogen through said trap section so as to trap silane.

15. A trapping device comprising:

an exhaust path for evacuating a spent gas from a hermetic chamber through a vacuum pump;

a trap section for trapping component substances from said spent gas flowing through said exhaust path;

a cooling device connected to said trap section for directly cooling said trap section through said direct heat conduction;

a cleaning path disposed adjacent to said exhaust path for flowing a cleaning solution for cleaning said trap section; and drive means for transposing said trap section to communicate either with said exhaust path or with said cleaning path.

16. A trapping device comprising:

an exhaust path for evacuating a spent gas from a hermetic chamber through a vacuum pump;

a trap section for trapping component substances from said spent gas flowing through said exhaust path;

a cleaning path disposed adjacent to said exhaust path for flowing a cleaning solution for cleaning said trap section; and drive means for switchingly transposing said trap section to communicate either with said exhaust path or with said cleaning path.

17. A trapping device comprising:

an exhaust path for evacuating a spent gas from a hermetic chamber through a vacuum pump;

a trap section for trapping component substances from said spent gas flowing through said exhaust path;

a cleaning path disposed adjacent to said exhaust path for flowing a cleaning solution for cleaning said trap section; and a housing defining a trap chamber and a cleaning chamber therein at locations respectively corresponding to said exhaust path and said cleaning path, said trap chamber and said cleaning chamber being mutually hermetic, and said trap section being movable between said trap chamber and said cleaning chamber.

* * * * *